United States Patent
Schindler et al.

(10) Patent No.: US 9,162,685 B2
(45) Date of Patent: Oct. 20, 2015

(54) DETECTION METHOD FOR OPERATING GESTURES

(71) Applicants: Mirko Schindler, Velbert (DE); Peter Van Gastel, Solingen (DE); Bernd Gerdes, Essen (DE)

(72) Inventors: Mirko Schindler, Velbert (DE); Peter Van Gastel, Solingen (DE); Bernd Gerdes, Essen (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 0 days.

(21) Appl. No.: 14/319,672

(22) Filed: Jun. 30, 2014

(65) Prior Publication Data

US 2015/0012176 A1 Jan. 8, 2015

(30) Foreign Application Priority Data

Jul. 3, 2013 (DE) .................. 10 2013 106 968
Sep. 23, 2013 (DE) .................. 10 2013 110 506

(51) Int. Cl.
| | |
|---|---|
| *B60W 50/08* | (2012.01) |
| *B60R 25/20* | (2013.01) |
| *H03K 17/955* | (2006.01) |
| *G07C 9/00* | (2006.01) |
| *E05F 15/73* | (2015.01) |

(52) U.S. Cl.
CPC ............ *B60W 50/08* (2013.01); *B60R 25/2054* (2013.01); *E05F 15/73* (2015.01); *E05Y 2400/10* (2013.01); *E05Y 2400/814* (2013.01); *E05Y 2400/852* (2013.01); *E05Y 2400/858* (2013.01); *E05Y 2800/10* (2013.01); *E05Y 2800/21* (2013.01); *E05Y 2800/40* (2013.01); *E05Y 2900/546* (2013.01); *E05Y 2900/548* (2013.01); *G07C 2009/00388* (2013.01); *H03K 17/955* (2013.01)

(58) Field of Classification Search
CPC . B60W 50/08; B60R 25/2054; H03K 17/955; E05F 15/76; G07C 2009/00388

USPC .......................................................... 701/36
See application file for complete search history.

(56) References Cited

U.S. PATENT DOCUMENTS

| | | | |
|---|---|---|---|
| 8,091,280 B2 | 1/2012 | Hanzel et al. | |
| 8,228,166 B2 * | 7/2012 | Eberhard | 340/5.72 |
| 2007/0205863 A1 * | 9/2007 | Eberhard | 340/5.72 |
| 2007/0285510 A1 * | 12/2007 | Lipton et al. | 348/135 |
| 2008/0296926 A1 * | 12/2008 | Hanzel et al. | 296/146.1 |
| 2011/0276234 A1 * | 11/2011 | Van Gastel | 701/49 |

FOREIGN PATENT DOCUMENTS

| | | |
|---|---|---|
| DE | 10 2004 041709 B3 | 10/2005 |
| DE | 10 2008 063366 A1 | 7/2010 |
| WO | WO 2012/034768 A1 | 3/2012 |

* cited by examiner

*Primary Examiner* — Mary Cheung
*Assistant Examiner* — Anne Mazzara
(74) *Attorney, Agent, or Firm* — Fay Sharpe LLP

(57) ABSTRACT

A method for operating a function in a motor vehicle employs a sensor arrangement with at least two spaced sensors for detecting operations caused by a user. Signals of a first sensor are monitored until a first characteristic signal answer is detected. A user-carried identification device is queried to verify authorization to access the requested function. Signals of a second sensor are monitored to determine an operation caused by approaching the second sensor. Signals from the first and second sensors are monitored for a predetermined time period t1. If the signals indicate a continued operation of the two sensors during t1, an expiration of t1 is signaled to the user. Signals of the first sensor are monitored for a predetermined time period t2. If the signal of the first sensor indicates a cancellation of the operation within t2, the function of the motor vehicle is triggered.

12 Claims, 2 Drawing Sheets

DETECTION METHOD FOR OPERATING GESTURES

BACKGROUND

The invention concerns a detecting method for operating gestures in a motor vehicle. In particular, the invention concerns a method of detecting gestures, made by a user, to access a vehicle function. Devices for contact-less operation of vehicle functions are known from the previous state of the art.

For example, DE 10 2008 063 366 describes a non-contact operating tailgate. This feature allows for a single user to open the tailgate by performing an operation gesture in the foot space under the rear bumper. Capacity sensors are provided in this device which are aligned in such a way as to detect different spatial regions and, based on their signals, an operation gesture is recognized.

Such a non-contact operation of a tailgate enhances comfort and safety if the manual operation of a tailgate, for whatever reason, is difficult for a person. The detection of movement can capture a feint kick movement, a lifting and swinging the leg or similar body motions, for example.

Operations being recognized and a function being triggered is, however, to be avoided, if a corresponding operating gesture was no specifically executed. This can happen, for example, by objects entering the detection range (balls, pets, or the like).

From DE 10 2004 041 709, a device for the contact-less operation of a trunk lid is known, wherein it is proposed to use two sensor arrays with separate detection areas. In this, an ultrasonic distance detection system which is already provided on the vehicle for distance measurements may, for example, be used as one of the sensor means. U.S. Pat. No. 8,091,280 discloses a hands-free operation device, where an optical detection of a foot is made in an optically selected area.

However, the existing detection systems are disadvantageous in terms of operation in various fields. If a user, on the basis of physical limitations or specifications of the behavior, is not able to perform a corresponding movement, said actuating systems are not suitable due to the dynamics of the movement required.

The object of the invention is to provide an evaluation method for non-contact operated sensor arrays which increases the recognition accuracy and takes into account restrictions on the movement capabilities of a user.

BRIEF SUMMARY

This object is achieved by a method having the features of claim 1.

The method of operation detection for a function in a motor vehicle possesses a sensor arrangement, wherein the sensor arrangement is comprised of at least two spaced sensor devices for detecting the respective operations by approaches of a user's body part. Said sensors each have a detection range. This is a space where an approach or presence of a user's body part is detected by the associated sensor device.

The detection itself may be done by the already-known types of proximity sensors, such as optical sensors, ultrasonic sensors or capacitive sensors. The sensor devices are arranged offset to the vehicle, and the detecting regions cover different spatial areas, with a partial overlap being possible.

According to the invention, the detection of an operation is slowed down in its dynamics. For this reason, the operation must be detected when a user retraces a certain behavior in a predetermined time scheme. In particular, the remaining of a body part in a detection area is required, as well as the removal of the body part from the control detection area after the signaling by the vehicle.

For this, the two sensor devices are used. One of the sensor arrays, herein referred to as the first sensor device, has its detection range aligned in such a way as to be turned away from the spaces the user and his body parts often frequent. For example, the detection range may be below the vehicle. The second sensor device monitors an area in which an operator must inevitably be located if he wants to carry out an operation in the area of the first sensor device.

By this double detection, a presence of bodies or objects being detected as an operator in the detection area of the first sensor device is being excluded, if it is an erroneous detection (eg balls or animals that are below a parked vehicle).

For detecting an operation, the signals of the first sensor device are monitored by the sensor devices until a characteristic first signal response s1 is detected by the first sensor, indicating an operation by approximation to the first sensor device.

What a characteristic signal response consists of can be seen in the state of the art depending on the sensors used. Capacitive sensors are comprised by significant change in the capacity of an electrode array (see, eg, WO 2012/034 768).

In addition, a query is done by an ID transmitter carried by the user, to verify an authorization for access to the requested function. Such ID transmitters are known from Keyless-Go systems and wirelessly communicate with the control system of the vehicle at a high frequency (HF). An alerting of the ID transmitter can also be performed in the low frequency range. This communication with the ID transmitter ensures that an operation can only be performed by an authorized person staying in a predetermined range around the vehicle.

However, the search antenna arrangement and control of antennas is regularly limited to a specific vehicle range, eg on the rear if a tailgate is to be operated. The query of the ID transmitter can be made dependent on whether the first sensor device has detected an approach or the presence of a body. In that case, the ID transmitter query follows the sensor detection.

However, this dependency is not required. There may also be an ID transmitter query before a sensor query, for example by repeatedly sending alert calls to the ID transmitter in the vehicle (polling system). In this case, the authorization is already available when the approximation is detected by the first sensor.

To check whether the presence or approach detection the first sensor device has been actually alerted by a user, the signals of a second sensor device is detected. The second Sensor device comprises a detection range offset from that of the first sensor device. The rule is that the body of a user must be in the coverage of the second sensor device if a valid operating of the first sensor device is to be detected. For example, the coverage of the second sensor device may be directed at an area at the side of the vehicle, where a person who moves a body part into the coverage of the first sensor device is located.

Thus, both an approach in the first sensor detection region, as well as in the second sensor device detection region must be detectable for a successful operation.

If these conditions are met, that is, the first sensor device and second sensor device both providing a characteristic signal concerning a presence of an operator's body part, a predetermined amount of time t1 is monitored on the vehicle side. During this period, both the sensor signals from the first sensor device and second sensor device must continue to detect the operator's body part or the operator in the detection area. For this, the two sensor devices are repeatedly or continuously queried during the time period t1, at least making a new query at the expiration of the time period t1.

If this testing of the signals show a continuing operation during the time period and at the end of the period, that is, an existing operator body part in the detection areas, the expiry of the time period t1 is signaled to the user.

In principle, the start of the time t1 can also be signaled to the user, but the expiration of the time period t1 is essential to the process. The signaling can be done in any suitable manner, for example via the light-emitting devices on the vehicle or by an acoustic signal.

This signal indicates to the user that the time period t1 has elapsed, and during this time, the operation request has been successfully detected and there has been a successful verification of the ID transmitter. Moreover, this is the signal to the user that a removal of the body part from the detection range of the sensor device is required for confirmation of the operating request. For this, the user has a limited period of time.

During this second period of time t2, the vehicle monitors the sensor devices and in the event that the first sensor device detects a distancing of the body part, the vehicle is turned on.

It is therefore essential that an operation is detected by using two time periods, a period of time t1 during which needs an operator leave his body part, such as a foot, in a detection range and a time period t2, in which the body part must be removed after a signal by the vehicle.

This procedure according to the invention also allows the operation of the vehicle function for people with physical limitations or for persons who do can not use certain user gestures because they are seen as inappropriate in their culture.

Suitable time periods t1 and t2 lie in the range of seconds to give the user sufficient time to react and enough time to show a clear use of will—for example, a time period t1 of a few seconds (for example, between 1 and 5 seconds) and a time period t2, which also amounts to a few seconds (eg, 1-3 seconds).

In a preferred execution of the process, capacitive sensor devices are used to form at least one of the sensor devices. The capacitive sensor devices are particularly useful for the detection of approaches in the exterior of a vehicle, as they are dependable and function reliably, even in various weather and environmental conditions.

In addition, capacitive sensor devices, unlike optical sensor, devices, deliver simply evaluated signals in the form of discrete charges, capacity- or voltage values, which can be supplied to simple evaluation electronics.

However, the use of an optical sensor device is possible for more sophisticated designs, for example in combination with, a capacitive sensor device. In particular, the area behind the vehicle can be additionally recorded by an existing optical sensor device fulfilling several purposes, for example by rear view cameras functioning also as a second sensor device.

It is particularly preferred if the method of the invention is used as an opening operation of a tailgate of the vehicle. Fundamentally, the method of the invention can be used in various vehicle functions, for example, on sliding doors or power-operated swing doors. However, in the area of the tailgate, the method of the invention is used with particular advantage, since the rear of the vehicle is often used as storage space for loads when an operator's hands are not free for a manual operation of the tailgate.

Then, the operation can be carried out according to the invention with an easy-to do, dependable and, compared to known methods, dynamically reduced operation with the foot or the leg.

In the above case, it is advisable to arrange the side detection zone of the first sensor device in an area below or below and at the side of the vehicle. For example, the first sensor device monitors a portion below the outer circumference of the vehicle close to the ground. The second sensor device has a detection range offset from the rear of the vehicle, that is, in a direction which corresponds to the approaching user during the loading of the trunk.

It is also preferable that, additionally to the signaling concerning time duration t1, the signal for the removal of the body part from the detection area, a signaling before the imminent opening of the trunk or the cover is carried out. This serves as a warning for the user so that he can possibly leave the swivel range of the vehicle flap.

Finally, it is also possible, within the scope of the invention, to provide the user with an operating aid in the form of a visual signal, which marks the cover area of the first sensor device intended for operation.

For this purpose, an LED or a laser diode can be used, marking the floor area meant for the controlling body part and its detection.

BRIEF DESCRIPTION OF THE DRAWINGS

The invention will now be explained with reference to the accompanying drawings.

FIG. 1b shows a schematic side view of the vehicle of FIG. 1a;

DETAILED DESCRIPTION

Figure 1A:
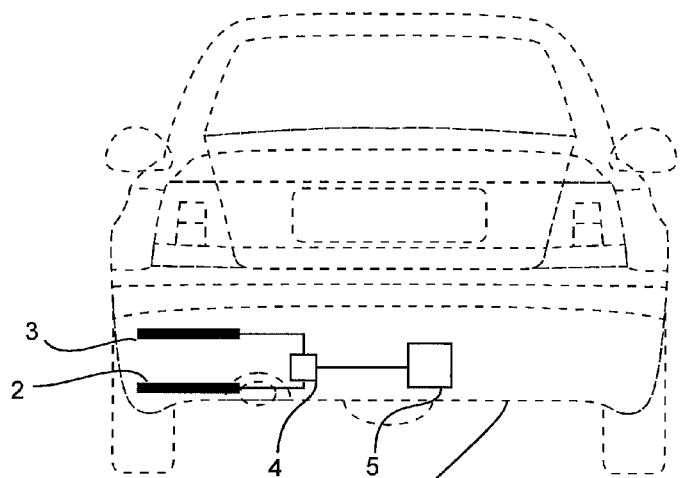
FIG. 1a shows the rear view of a vehicle for carrying out the method according to the invention.
Figure 1B:
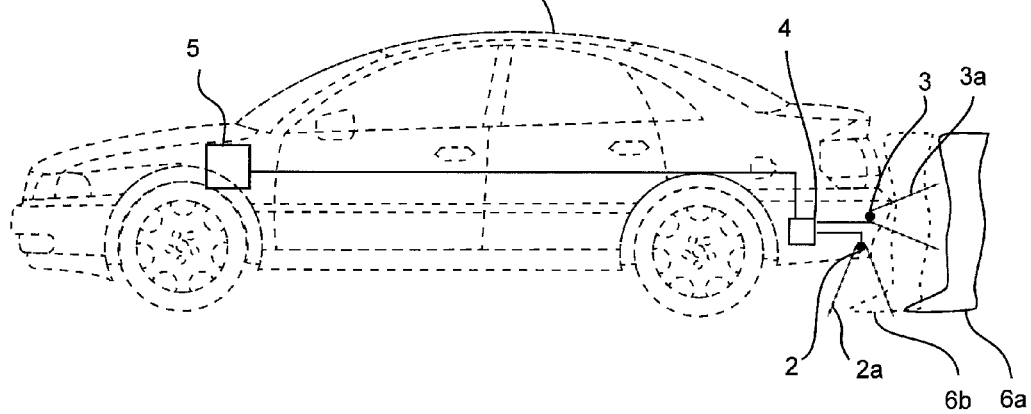

In FIGS. 1a and 1b, a vehicle 1 is shown, in which the sensor electrodes 2, 3 are arranged in the rear region. Said sensor electrodes are connected to a control unit, which controls the sensor electrode as capacitive electrodes, and determines the respective capacitance of the electrode assembly. This control unit is in turn coupled to a central control unit in the vehicle.

The control unit 4 takes over the control of the electrodes 2, 3 and the signal processing, that is, the determination of signal responses and their assignment to a control signal.

A generated control signal may be transmitted from the control device 4 to the central control unit 5, which in turn is capable of performing the closing operation of the tailgate as well as the electrical opening.

Electrode 2 is arranged as a component of a first sensor device in the lower rear area and its detection area 2a is directed downwards, as can be seen in FIG. 1b. Electrode 3 and the detection area 3a is directed to the rear. It can be seen that the detection areas 2a and 3a do not overlap in this example.

FIG. 1b shows the leg of a user in two different positions. 6a shows the position of the user standing behind the rear of the vehicle and the user's leg is to be detected, if necessary, by the sensor assembly 3 with the detection area 3a, but not by the sensor assembly 2, with its sensing range 2a. However, if the user steps closely to the tailgate and moves his foot into the detection area 2a, as shown in the position 6b, both a detection in the area 3a, as well as a detection in area 2a, is possible.

In this position, a possible user request is detected by the signal of sensor 2 and a time duration t1 is started, during which the user must remain in the position 6b. The end of the time period t1 is to be signaled to the user by an acoustic signal. He then moves from the position 6b back to the position 6a, leaving detection area 2a.

If this is done within a predetermined period of time t2, measured from the signal, control device 4 sends a signal of a valid operation to controller 5 and the tailgate is opened.

Figure 2:
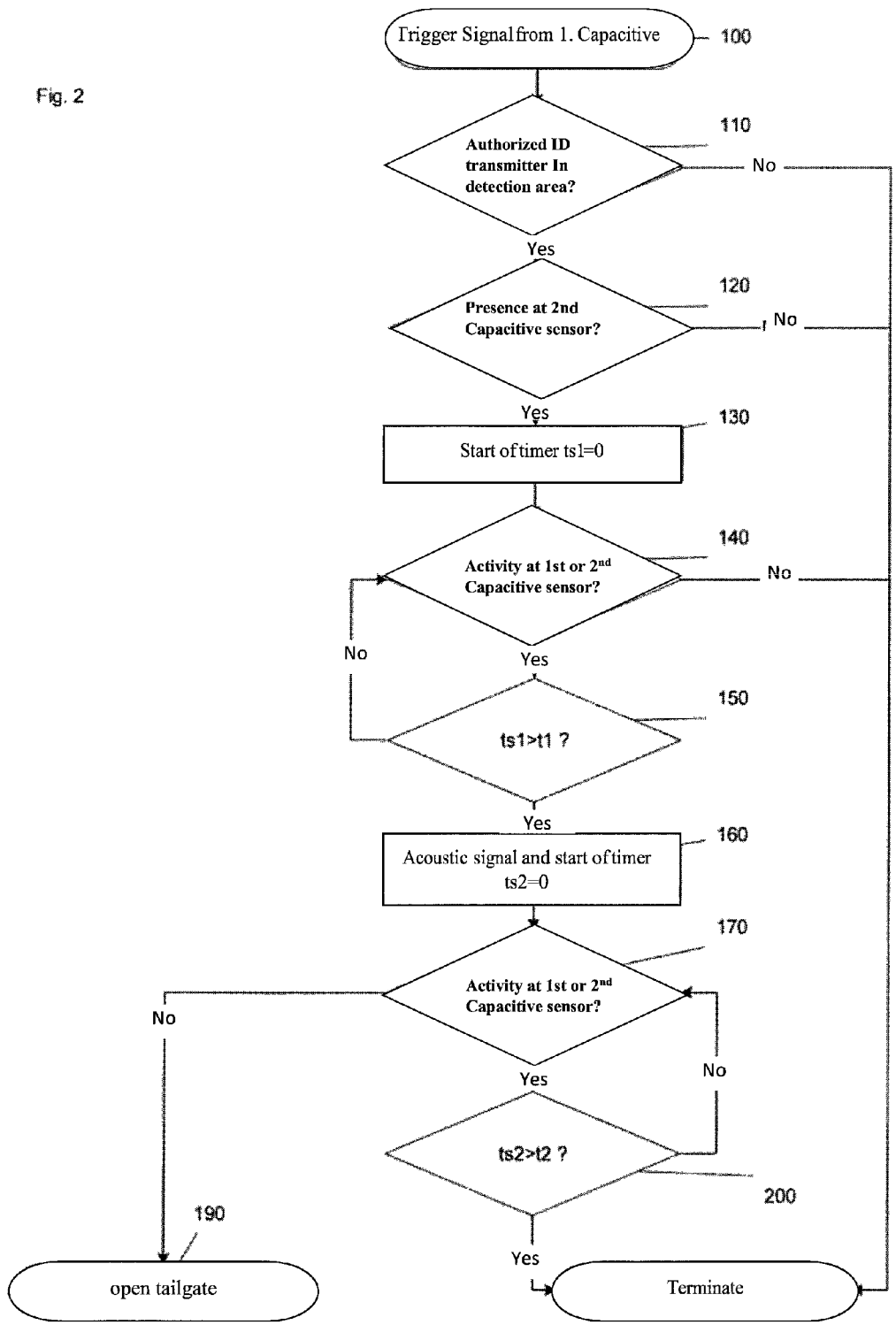
FIG. 2 shows a flow chart of an embodiment of the method according to the invention.

The stages of this procedure are represented as a flow chart in FIG. 2. In this model, the signal of the first capacitive sensor (sensor 2 from FIGS. 1a and 1b) is used as the trigger for the process. If an approach is detected in this detection range, the method is initiated at step 100.

At 110, the query of the ID transmitter, which the user must carry in order to be able to perform a key-less operation, ensues. This request is usually carried out on transmission of an LF wake-up signal from the vehicle to the ID transmitter, which responds to the Vehicle by using a communication sequence in the HF range.

If the authorization is not successful, for example because a person tries to do the gesture without a legitimate ID transmitter, the procedure is aborted. If a successful authorization is performed, it is checked whether the rearward capacitive sensor (reference numeral 3 in FIGS. 1a and 1b) is confirming the presence of the user at step 120.

This is necessary because, for example, a user could stay in the rear area of the vehicle with a dog on a leash and a legitimate ID transmitter, and the dog enters the detection range of the first sensor. The verification of the presence with the second sensor ensures that a tripping can only be triggered by the user being located in the operational area.

When the above is confirmed, the timer ts1 is set to zero and started by the vehicle at step 130 and during the time period t1, the activities of the two sensing devices are monitored. Activity in this context means that a continuous detection of the approach or presence by sensors must be carried out.

If the user removes his leg from one of the detection areas of the first or of the second sensor within the time period t1, a lack of activity is detected in the sensor (140) and the process is terminated. If the period ts1 is greater than the predetermined time period t1 (150), an acoustic signal is put out and a second timer ts2 is started (160).

During the course of time period t2, it is again checked whether a persistent activity at the first or the second capacitive sensor (170) is confirmed. If this is not the case, the procedure continues with step 190 and a control signal sent to the control unit of the vehicle, which then opens the tailgate. In this case, it is signaled that the user has removed his foot from the detection zone. Otherwise, the procedure is terminated place after the lapse of time period t2.

The invention claimed is:

1. A method for operating a function in a motor vehicle, including a sensor arrangement which has at least two spaced sensor devices for detecting the respective operations caused by the approach of a body part of a user, including the steps,
    monitoring the signals of a first sensor device until a first characteristic signal answer is detected by the first sensor device,
    querying a user-carried identification device to verify authorization to access the requested function,
    querying of signals of a second sensor device and evaluating an associated second signal answer to determine an operation caused by approaching the second sensor device,
    if the second signal answer indicates an operation caused by an approach towards the second sensor device, monitoring signals from the first and second sensor devices for a first predetermined time duration,
    if the signals indicate a continued operation of the two sensor devices during the first predetermined time period, signaling the expiration of the first predetermined time period to the user,
    monitoring the signals of the first sensor device for a second predetermined time period,
    if the signal of the first sensor device indicates a discontinuation of the operation within the second predetermined time period, triggering the function of the motor vehicle.

2. The method according to claim 1, wherein at least one of the sensor devices is formed as a capacitive sensor device.

3. The method according to claim 1, wherein at least one of the sensor devices is formed as an optical sensor device.

4. The method according to claim 1, wherein the function to be triggered results in the opening of the tailgate of the motor vehicle.

5. The method according to claim 4, wherein the sensor devices are arranged at the rear of the motor vehicle and the first sensor device comprises a first detection area below the vehicle and the second sensor device comprises a second detecting portion which is offset from the first detection area to the rear in vehicle direction.

6. The method according to claim 1, wherein the end of the first predetermined time period is optically or acoustically signaled.

7. The method according to claim 1, wherein the second predetermined time period is smaller than the first predetermined time period.

8. The method according to claim 1, wherein the first predetermined time period is less than five second.

9. The method according to claim 1, wherein an acoustic or visual signal is provided to the user immediately before the initiation of the function of the vehicle.

10. The method according to claim 1, wherein a detection range of at least one sensor device is marked by a lighting device arranged on the vehicle.

11. The method according to claim 10, wherein the lighting device is activated after the query of the user-carried ID transmitter has acquired authorization.

12. The method according to claim 1, wherein the first predetermined time period is less than three seconds.

* * * * *